(12) United States Patent
Park

(10) Patent No.: US 12,740,165 B2
(45) Date of Patent: Sep. 15, 2026

(54) SINGLE PHOTON AVALANCHE DIODE

(71) Applicant: SK hynix Inc., Icheon-si (KR)

(72) Inventor: Soon Yeol Park, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 401 days.

(21) Appl. No.: 18/487,591

(22) Filed: Oct. 16, 2023

(65) Prior Publication Data

US 2024/0047489 A1 Feb. 8, 2024

Related U.S. Application Data

(63) Continuation-in-part of application No. 17/320,605, filed on May 14, 2021, now Pat. No. 11,791,433.

(30) Foreign Application Priority Data

Feb. 9, 2021 (KR) ........................ 10-2021-0018102

(51) Int. Cl.
*H10F 39/00* (2025.01)
*G01S 7/481* (2006.01)
(Continued)

(52) U.S. Cl.
CPC ........ *H10F 39/8033* (2025.01); *G01S 7/4816* (2013.01); *G01S 7/4865* (2013.01); *G01S 17/894* (2020.01); *H10F 39/802* (2025.01)

(58) Field of Classification Search
CPC .. H10F 39/8033; H10F 39/802; G01S 7/4816; G01S 7/4865; G01S 7/4863; G01S 17/894
See application file for complete search history.

(56) References Cited

U.S. PATENT DOCUMENTS 5,621,222 A * 4/1997 Kimura ............. H01L 21/02507 257/618
5,965,875 A * 10/1999 Merrill ................ H10F 39/1825 348/E3.018

(Continued)

FOREIGN PATENT DOCUMENTS

CN 104952868 A 9/2015
CN 105185796 A 12/2015

(Continued)

OTHER PUBLICATIONS

Office Action for TW Appl. No. 110139069, mailed on Apr. 29, 2025, 8 pages.

(Continued)

*Primary Examiner* — Sitaramarao S Yechuri
(74) *Attorney, Agent, or Firm* — Ashurst Perkins Coie US LLP

(57) ABSTRACT

A single photon avalanche diode may include a first diode, a second diode and a third diode. The first diode includes a first PN junction vertically spaced from a light-receiving surface by a first depth. The second diode is in partial contact with the first diode. The second diode includes a second PN junction vertically spaced from the light-receiving surface by a second depth greater than the first depth. The third diode is in partial contact with the second diode. The third diode includes a third PN junction spaced from the light-receiving surface by a third depth greater than the second depth. The first to third diodes have different breakdown voltages from one another.

14 Claims, 12 Drawing Sheets

(51) Int. Cl.

| | |
|---|---|
| ***G01S 7/4865*** | (2020.01) |
| ***G01S 17/894*** | (2020.01) |

(56) References Cited

U.S. PATENT DOCUMENTS

| | | | |
|---|---|---|---|
| 9,178,100 B2 | 11/2015 | Webster et al. | |
| 10,193,009 B1 | 1/2019 | Roy | |
| 2005/0127275 A1* | 6/2005 | Yang | H10F 71/121<br>250/214 R |
| 2010/0271108 A1 | 10/2010 | Sanfilippo et al. | |
| 2014/0138735 A1 | 5/2014 | Clarke | |
| 2016/0268245 A1 | 9/2016 | Chen | |
| 2017/0186798 A1 | 6/2017 | Yang et al. | |
| 2018/0158849 A1 | 6/2018 | Henkel et al. | |
| 2020/0091205 A1 | 3/2020 | Shinohara | |
| 2020/0091283 A1 | 3/2020 | Matsushita | |
| 2020/0152807 A1* | 5/2020 | Röhrer | H10F 77/14 |
| 2020/0185560 A1 | 6/2020 | Giroud-Garampon | |
| 2020/0328314 A1 | 10/2020 | Moore | |
| 2020/0335546 A1 | 10/2020 | Miura | |
| 2021/0375959 A1* | 12/2021 | Hung | H10F 39/8033 |
| 2022/0254946 A1 | 8/2022 | Park | |

FOREIGN PATENT DOCUMENTS

| | | |
|---|---|---|
| CN | 105679875 A | 6/2016 |
| CN | 107026212 A | 8/2017 |
| CN | 107946389 A | 4/2018 |
| CN | 109494278 A | 3/2019 |
| CN | 110197859 A | 9/2019 |
| CN | 110892533 A | 3/2020 |
| CN | 111868932 A | 10/2020 |
| DE | 3921028 A | 1/1991 |
| EP | 2144303 A1 | 1/2010 |
| EP | 3477710 A1 | 5/2019 |
| EP | 3664164 A1 | 6/2020 |
| GB | 2557303 A | 6/2018 |
| WO | 2012032353 A2 | 3/2012 |
| WO | 2012149195 A1 | 11/2012 |

OTHER PUBLICATIONS

Notification to Grant Patent Right for Invention for CN Appl. No. 202111241549.6, mailed on Jun. 17, 2024, 7 pages with English translation.

Chinese Patent Office, First Office Action for CN Appl. No. 202111241549.6, mailed on Jan. 17, 2024, 18 pages with English translation.

* cited by examiner

SINGLE PHOTON AVALANCHE DIODE

CROSS-REFERENCES TO RELATED APPLICATION

This patent document is a continuation-in-part of U.S. patent application Ser. No. 17/320,605, filed on May 14, 2021 titled "SINGLE PHOTON AVALANCHE DIODE," and claims the priority and benefits of Korean patent application number 10-2021-0018102, filed on Feb. 9, 2021, which are incorporated herein by reference in their entirety.

TECHNICAL FIELD

The technology and implementations disclosed in this patent document generally relate to a single photon avalanche diode.

BACKGROUND

A recently spotlighted time of flight (TOF) technology may include irradiating a light having a pulse shape to an object from a light source in or around a sensor, receiving a reflected light to measure a time between the object and the light source, and extracting a distance between the object and the light source based on a principle of constancy of light velocity.

In order to accurately measure the TOF, a reaction needs to be generated as soon as the light is received by a light-receiving element. Thus, a photoelectric transformation element having a high sensitivity is desired. A single photo avalanche diode (SPAD) manufactured by a CMOS process technology has been widely studied and developed.

SUMMARY

Example embodiments of the disclosed technology provide a single photon avalanche diode including multi-depletion regions.

In example embodiments of the disclosed technology, a single photon avalanche diode may include a first diode, a second diode and a third diode. The first diode includes a first PN junction vertically spaced from a light-receiving surface by a first depth. The second diode is in partial contact with the first diode. The second diode includes a second PN junction vertically spaced from the light-receiving surface by a second depth greater than the first depth. The third diode is in partial contact with the second diode. The third diode includes a third PN junction spaced from the light-receiving surface by a third depth greater than the second depth. The first to third diodes have different breakdown voltages from one another.

In example embodiments of the disclosed technology, a single photon avalanche diode may include a first diode, a second diode, a third diode, a first isolation region and a second isolation region. The first diode has a lower surface and side surfaces connected to ends of the lower surface. The second diode is disposed to surround the lower surface and the side surfaces of the first diode. The second diode has a lower surface and side surfaces connected to ends of the lower surface of the second diode. The third diode is disposed to surround the lower surface and the side surfaces of the second diode. The third diode has a lower surface and side surfaces connected to ends of the lower surface of the third diode. The first isolation region is disposed between the side surfaces of the first diode and the side surfaces of the second diode. The second isolation region is disposed between the side surfaces of the second diode and the side surfaces of the third diode According to example embodiments, the junction structures may be vertically overlapped with each other to form the single photon avalanche diode including multi-depletion regions. Thus, the single photon avalanche diode may have multi operational voltages corresponding to numbers of the multi-depletion regions. Therefore, the single photon avalanche diode may have improved detection sensitivity in various environments and wide application fields.

BRIEF DESCRIPTION OF THE DRAWINGS

The above and another aspects, features and advantages of the subject matter of the disclosed technology will be more clearly understood from the following detailed description taken in conjunction with the accompanying drawings.

DETAILED DESCRIPTION

Various embodiments of the disclosed technology will be described in greater detail with reference to the accompanying drawings.

The disclosed example embodiments may provide a single photon avalanche diode including multi-depletion regions and having a plurality of operational voltages. In comparison, some designs of conventional single photo avalanche diodes may have only one operational voltage. The single photo avalanche diode may have a photo detection sensitivity and an application field that corresponds to an operational voltage. Thus, when the single photon avalanche diode has the plurality of the operational voltages, the single photon avalanche diode can be widely used in various fields.

For example, the single photon avalanche diode may be used for a photoelectric transformation element including a photosensitive P-N junction. The single photon avalanche diode may receive and detect a single photon from an object to generate a current pulse corresponding to the detected single photon. An avalanche breakdown may be triggered by an incident single photon in the Geiger mode where a reverse bias voltage including a voltage between a cathode and an anode higher than a breakdown voltage may be applied to generate the current pulse. The avalanche breakdown may be generated at a depletion region in the single photon avalanche diode. When the reverse bias voltage is applied to the single photon avalanche diode to increase an electric field, electrons, which have been generated by absorption of incident photons, may move due to the presence of the strong electric field and the impact ionization occurs to generate an electron-hole pair. In the single photon avalanche diode operated in the Geiger mode where the reverse bias voltage higher than the breakdown voltage is applied, carriers such as electrons or holes, which may be generated by the incident light, and the electrons and the holes, which may be generated by the impact ionization, may collide against each other to generate numerous carriers. Therefore, although the single photon is incident to the single photon avalanche diode, the single photon may trigger the avalanche breakdown to generate a measurable current pulse.

Hereinafter, a first conductive type and a second conductive type refer to complimentary conductive types. The first conductive type may be a P type and the second conductive type may be an N type. A first direction D1, a second direction D2 and a third direction D3 may be substantially perpendicular to each other. For example, in an XYZ coordinate, the first direction D1 may be an X-direction, the second direction D2 may be a Y-direction, and a third direction D3 may be a Z-direction.

Figure 1A:
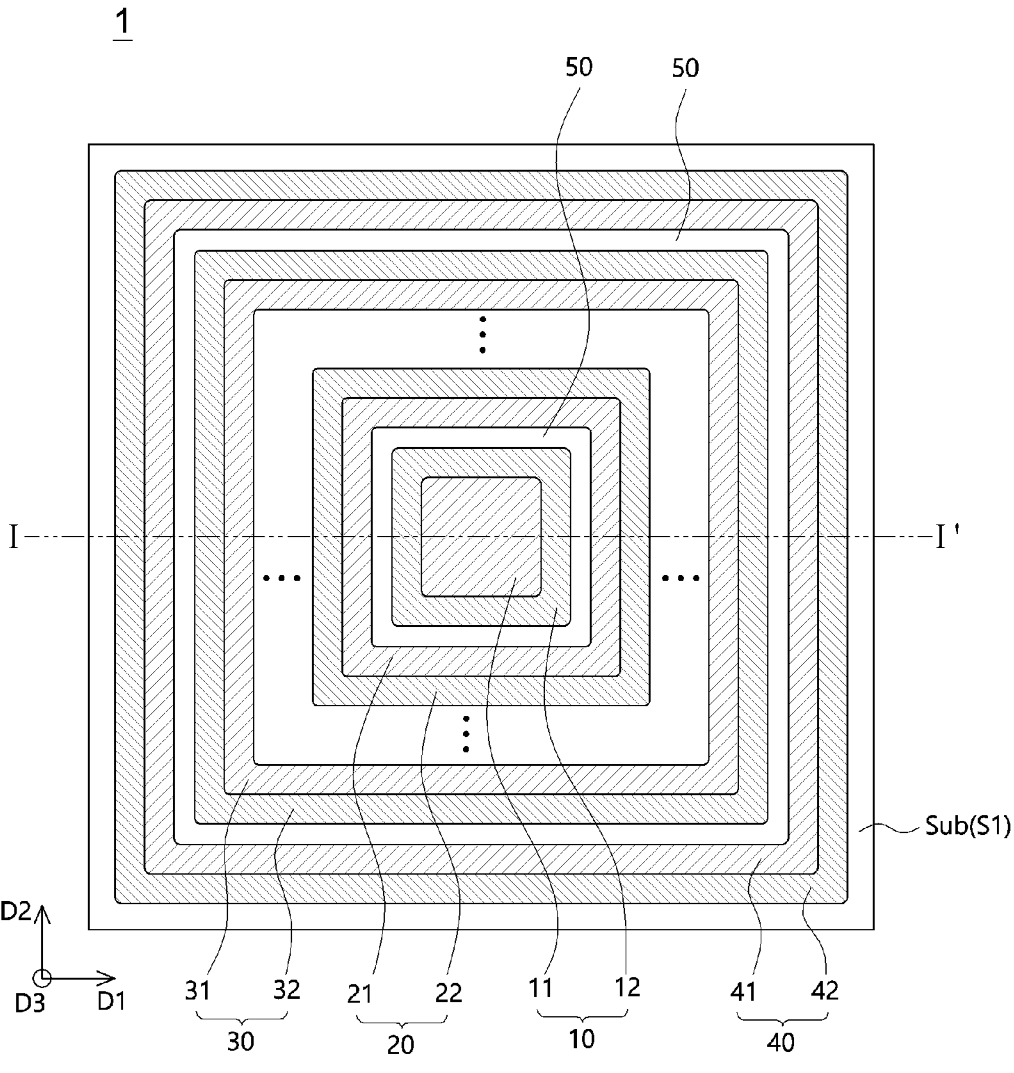
FIG. 1A is a plan view illustrating a single photon avalanche diode in accordance with example embodiments of the disclosed technology.
Figure 1B:
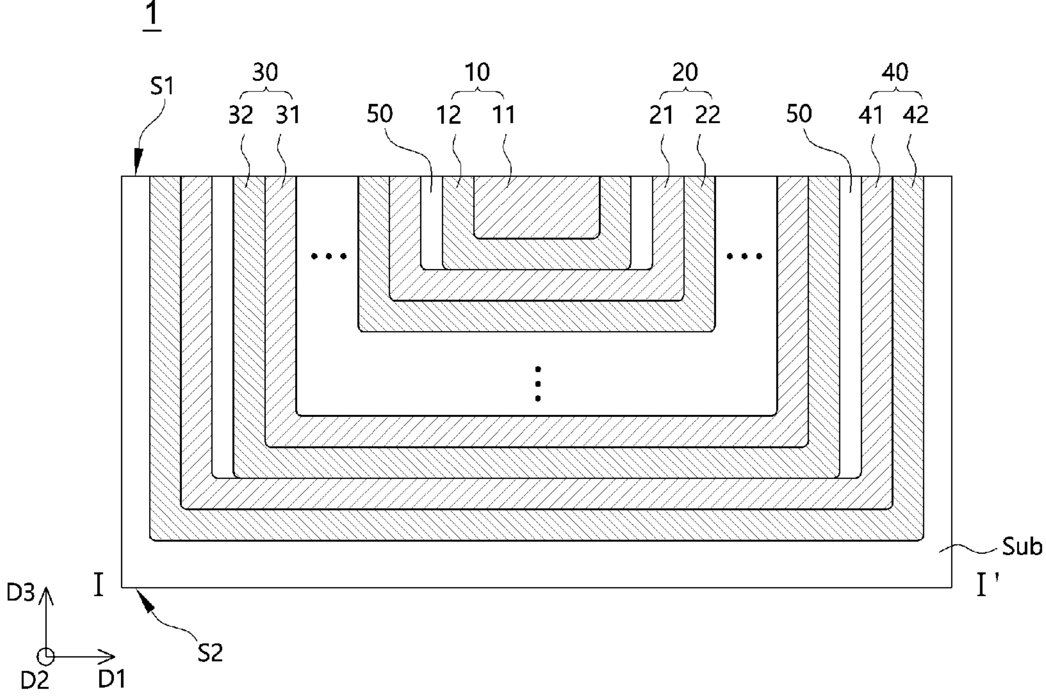
FIG. 1B is a cross-sectional view taken along a line I-I' in FIG. 1A.

FIG. 1A is a plan view illustrating a single photon avalanche diode in accordance with example embodiments, and FIG. 1B is a cross-sectional view taken along a line I-I' in FIG. 1A.

Referring to FIGS. 1A and 1B, a single photon avalanche diode 1 of example embodiments may include a substrate Sub and a plurality of junction structures 10, 20, 30 and 40. The substrate Sub has an upper surface S1 and a lower surface S2. The junction structures 10, 20, 30 and 40 may be formed on the substrate Sub to make contact with the upper surface S1 of the substrate Sub. The junction structures 10, 20, 30 and 40 may be overlapped with each other along the third direction D3. Each of the junction structures 10, 20, 30 and 40 may include a P-N junction diode. Each of an anode and a cathode of the P-N junction diode of each junction structure may be configured to receive a bias voltage to operate the single photon avalanche diode. For example, the bias voltages that are received by the anode and the cathode of different junction structures may be adjusted to provide different operational voltages of the diode.

Further, the single photon avalanche diode 1 may include isolation regions 50 formed at the substrate Sub. The isolation regions 50 may be arranged between any two adjacent ones of the junction structures 10, 20, 30 and 40. Each of the isolation regions 50 may have a pipe shape configured to make contact with the upper surface S1 of the substrate Sub. Each of the isolation regions 50 may be extended in the third direction D3. Each of the isolation regions 50 may include impurity regions 11, 21, 31 and 41 having the first conductive type, or a trench type isolation layer. The trench type isolation layer may include a trench formed on the upper surface S1 of the substrate Sub, and an insulation layer formed in the trench.

The substrate Sub may include a bulk single crystalline silicon wafer, a silicon-on-insulation (SOT) wafer, a compound semiconductor wafer such as Si—Ge, a wafer including a silicon epitaxial layer, etc. For example, the substrate Sub may include a bulk single crystalline silicon wafer doped with first conductive type impurities, for example, P type impurities.

The upper surface S1 of the substrate Sub may be a front side. Although not depicted in drawings, control circuits in FIGS. 4 and 5 for controlling the single photon avalanche diode 1 may be provided, e.g., being formed on the upper surface S1 of the substrate Sub. The lower surface S2 of the substrate Sub may be a back side. Further, at least one of the upper surface S1 and the lower surface S2 of the substrate Sub may be an incidence surface to which a light may be incident. Thus, although not depicted in drawings, an optical filter, a micro-lens, etc., may be formed on the lower surface S2 of the substrate Sub.

Each of the junction structures 10, 20, 30 and 40 may include first impurity regions 11, 21, 31 and 41 having the first conductive type and second impurity regions 12, 22, 32 and 42 having the second conductive type. For example, when the first conductive type may be the P type and the second conductive type may be the N type, the first impurity regions 11, 21, 31 and 41 may correspond to an anode and the second impurity regions 12, 22, 32 and 42 may correspond to a cathode. The first impurity regions 11, 21, 31 and 41 and the second impurity regions 12, 22, 32 and 42 in each of the junction structures 10, 20, 30 and 40 may be configured to make contact with the upper surface S1 of the substrate Sub. The first impurity regions 11, 21, 31 and 41 and the second impurity regions 12, 22, 32 and 42 may be configured to receive a bias through the upper surface S1 of the substrate Sub. The second impurity regions 12, 22, 32 and 42 may be configured to surround a side surface and a bottom surface of the first impurity regions 11, 21, 31 and 41. Particularly, the second impurity regions 12, 22, 32 and 42 may be configured to make contact with the side surface and the bottom surface of the first impurity regions 11, 21, 31 and 41.

The first impurity region 11 of the first junction structure 10 positioned at a central portion of the junction structures 10, 20, 30 and 40 may have a plate shape. The second impurity region 12 of the first junction structure 10 may have a cylindrical shape configured to surround the side surface and the bottom surface of the first impurity region. The second impurity region 12 of the first junction structure 10 may have a planar annular shape viewed from the upper surface S1 of the substrate Sub. The second impurity region 12 of the first junction structure 10 may have a planar plate shape viewed from the lower surface S2 of the substrate Sub. The second impurity region 12 of the first junction structure 10 may have a cross-sectional "U" shape.

The second junction structure 20 among the junction structures 10, 20, 30 and 40 may be configured to surround the side surface and the bottom surface of the first junction structure 10. Thus, each of the first impurity region 21 and the second impurity region 22 in the second junction structure 20 may have a cylindrical shape. The isolation region 50 may be positioned between the second impurity region 12 of the first junction structure 10 and the first impurity region 21 of the second junction structure 20. The isolation region 50 may have a depth measured from the upper surface S1 of the substrate Sub that is substantially the same as a depth of the first junction structure 10 inside the isolation region 50.

Among the junction structures 10, 20, 30 and 40, any two adjacent junction structures can be located that one of two junction structures is relatively closer to a central portion of the substrate and the other of the two junction structures is relatively closer to an edge portion of the substrate. The one that is relatively closer to the central portion of the substrate can be referred to as an inner junction structure and the other one that is relatively closer to the edge portion of the substrate can be referred to an outer junction structure. The outer junction structure may be configured to surround the side surface and the bottom surface of the inner junction structure 30. Thus, the first impurity regions 21, 31 and 41 and the second impurity regions 22, 32 and 42 in each of the second junction structure 20 to the fourth junction structure 40 may have a cylindrical shape. The first impurity region 41 of the Nth junction structure 40 may be configured to make contact with the bottom surface of the second impurity region 32 of the (N−1)th junction structure 30, whereby N is an integer greater than 1. Further, the first impurity region 41 of the Nth junction structure 40 may be spaced apart from the side surface of the second impurity region 32 of the (N−1)th junction structure 30. Thus, the isolation region 50 may be inserted into between the side surface of the first impurity region 41 of the Nth junction structure 40 and the side surface of the second impurity region 32 of the (N−1)th junction structure 30 facing the side surface of the first impurity region 41 of the Nth junction structure 40. When the isolation region 50 may include the first conductive type impurity region, the isolation region 50 may have an impurity doping concentration lower than an impurity doping concentration of the first impurity regions 21, 31 and 41.

Vertically extended portions of the first impurity regions 21, 31 and 41 and the second impurity regions 22, 32 and 42 in the second junction structure 20 to the Nth junction structure 40 may have a width less than a vertical depth of horizontally extended portions of the first impurity regions 21, 31 and 41 and the second impurity regions 22, 32 and 42 in the second junction structure 20 to the Nth junction structure 40.

As mentioned above, the plurality of the junction structures 10, 20, 30 and 40 may be vertically stacked such that any two adjacent ones of the junction structures 10, 20, 30 and 40 have a common surface to contact with each other, thereby providing the single photon avalanche diode 1 with the multi-depletion regions. Thus, the single photon avalanche diode 1 may have multi-operational voltages corresponding to numbers of the multi-depletion regions. Therefore, the single photon avalanche diode 1 may have improved detection sensitivity in various environments and wide application fields. One depletion region may be generated at each of the junction structures 10, 20, 30 and 40. Further, one depletion region may also be generated at each of the contact regions between the junction structures 10, 20, 30 and 40.

Figure 2A:
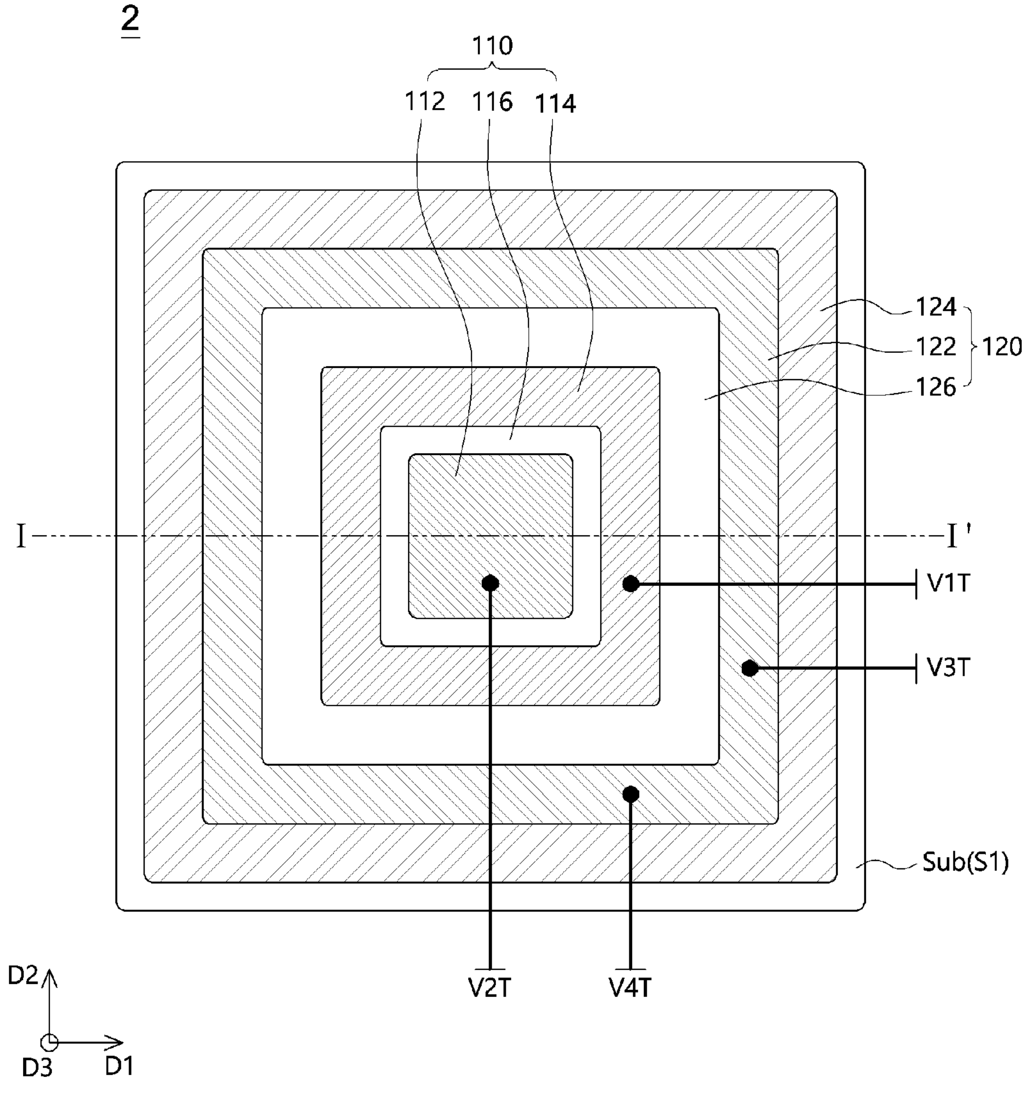
FIG. 2A is a plan view illustrating a single photon avalanche diode in accordance with example embodiments of the disclosed technology.
Figure 2B:
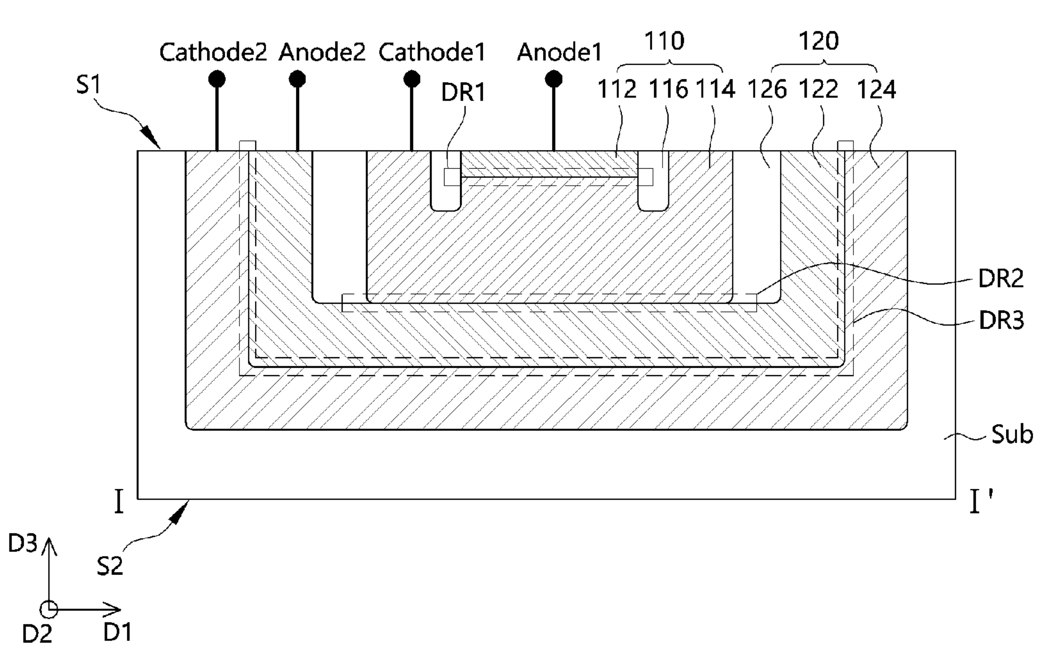
FIG. 2B is a cross-sectional view taken along a line I-I' in FIG. 2A.
Figure 2C:
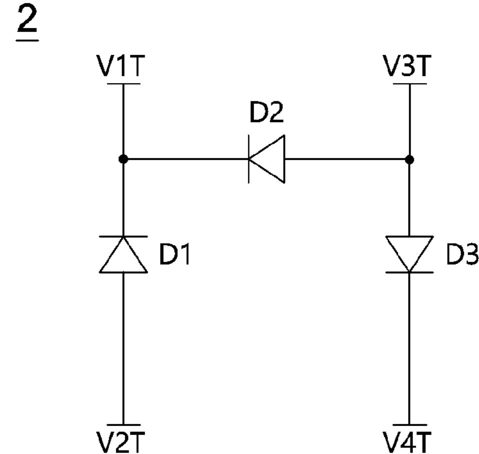
FIG. 2C is a circuit diagram of a single photon avalanche diode in accordance with example embodiments.
Figure 2D:
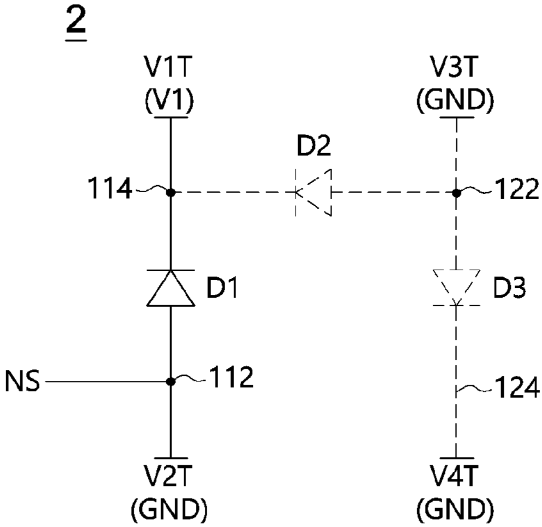
FIG. 2D is an equivalent circuit diagram of a single-photon avalanche diode at a first operating voltage in accordance with example embodiments.
Figure 2E:
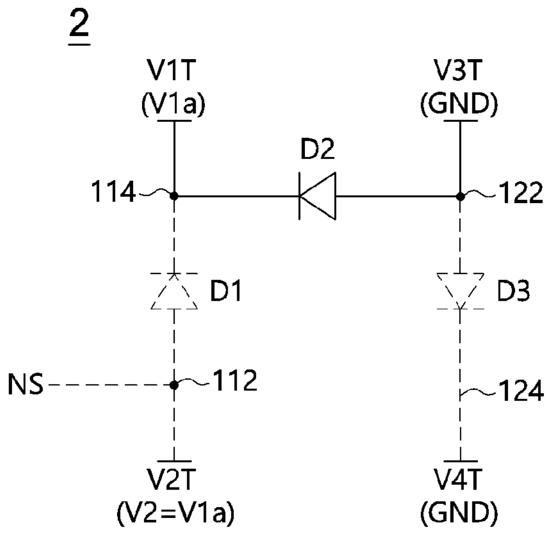
FIG. 2E is an equivalent circuit diagram of a single-photon avalanche diode at a second operating voltage in accordance with example embodiments.
Figure 2F:
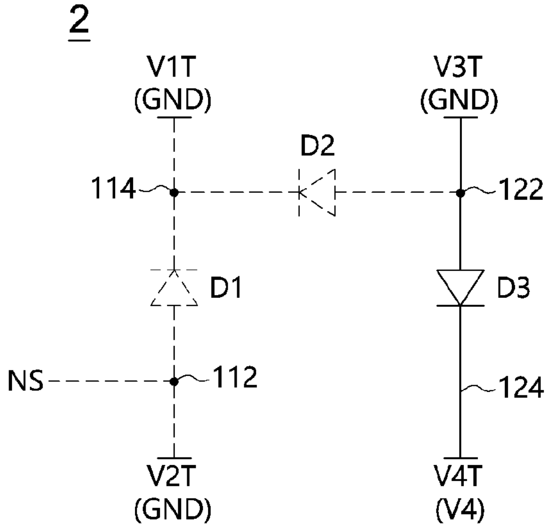
FIG. 2F is an equivalent circuit diagram of a single-photon avalanche diode at a third operating voltage in accordance with example embodiments.
Figure 2G:
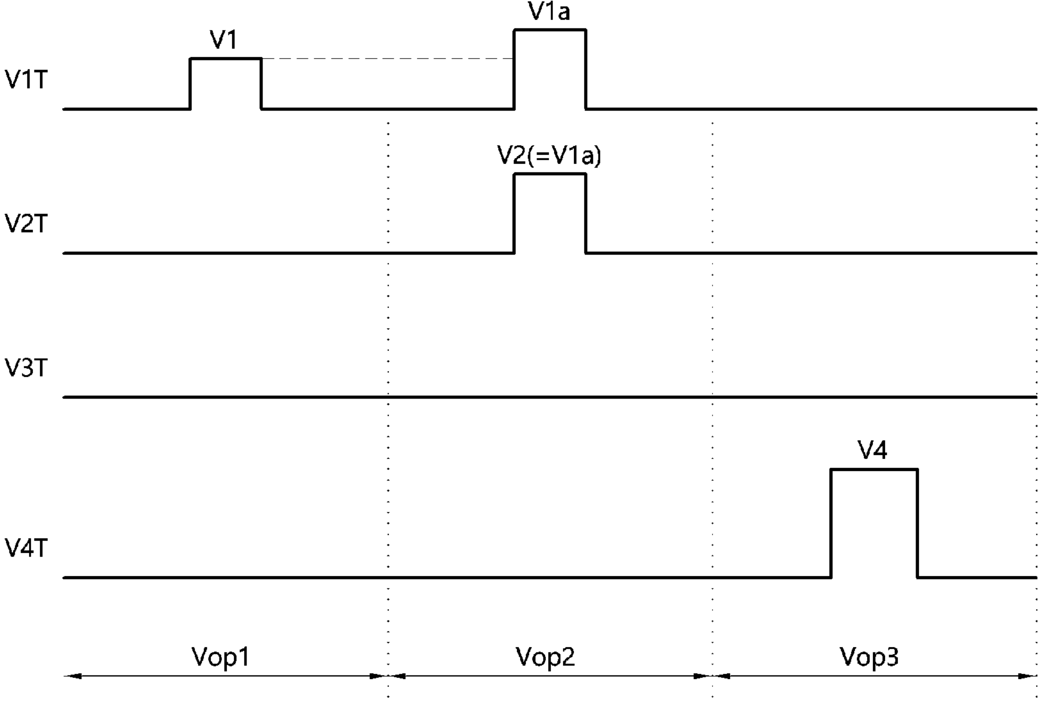
FIG. 2G is a timing diagram of voltages applied to a single photon avalanche diode in accordance with example embodiments.

FIG. 2A is a plan view illustrating a single photon avalanche diode in accordance with example embodiments, and FIG. 2B is a cross-sectional view taken along a line I-I' in FIG. 2A. FIG. 2C is a circuit diagram of a single photon avalanche diode in accordance with example embodiments. FIG. 2D is an equivalent circuit diagram of a single-photon avalanche diode at a first operating voltage in accordance with example embodiments. FIG. 2E is an equivalent circuit diagram of a single-photon avalanche diode at a second operating voltage in accordance with example embodiments. FIG. 2F is an equivalent circuit diagram of a single-photon avalanche diode at a third operating voltage in accordance with example embodiments. FIG. 2G is a timing diagram of voltages applied to a single photon avalanche diode in accordance with example embodiments. Hereinafter, a single photon avalanche diode having different three operational voltages may be illustrated with reference to FIGS. 2A to 2G.

Referring to FIGS. 2A to 2G, the single photon avalanche diode 2 of example embodiments may include a substrate Sub, a first junction structure 110 and a second junction structure 120. The substrate Sub may have an upper surface S1 and a lower surface S2. The first junction structure 110 may be formed on the substrate Sub to make contact with the upper surface S1 of the substrate Sub. The second junction structure 120 may be configured to surround a side surface and a bottom surface of the first junction structure 110. Each of the first junction structure 110 and the second junction structure 120 may include a P-N junction diode. Each of the first junction structure 110 and the second junction structure 120 may include a first anode Anode1, a first cathode Cathode1, a second anode Anode2 and a second cathode Cathode2 configured to receive a bias.

As shown in FIG. 2C, the single photon avalanche diode 2 may include a first diode D1, a second diode D2, and a third diode D3 that are generated between the first junction structure 110 and the second junction structure 120.

For example, the first diode D1 may be generated between the first cathode Cathode 1 and the first anode Anode1 of the first junction structure 110. The first cathode Cathode1 may be electrically coupled to a first voltage terminal (V1T), and the first anode Anode1 may be electrically coupled a second voltage terminal (V2T). The second diode D2 may be generated between the first cathode Cathode1 of the first junction structure 110 and the second anode Anode2 of the second junction structure 120. The second anode Anode2 may be electrically coupled to a third voltage terminal (V3T). The third diode D3 may be generated between the second cathode Cathode2 and the second anode Anode2 of the second junction structure 120. The second cathode may be electrically coupled to a fourth voltage terminal (V4T).

The substrate Sub may include a bulk single crystalline silicon wafer, a silicon-on-insulation (SOI) wafer, a compound semiconductor wafer such as Si—Ge, a wafer including a silicon epitaxial layer, etc. For example, the substrate Sub may include a bulk single crystalline silicon wafer doped with first conductive type impurities, for example, P type impurities. The upper surface S1 of the substrate Sub may be a front side. Although not depicted in drawings, control circuits in FIGS. 4 and 5 for controlling the single photon avalanche diode 1 may be formed on the upper surface S1 of the substrate Sub. The lower surface S2 of the substrate Sub may be a back side. Further, the lower surface S2 of the substrate Sub may be an incidence surface to which a light may be incident. Thus, although not depicted in drawings, an optical filter, a micro-lens, etc., may be formed on the lower surface S2 of the substrate Sub.

The first junction structure 110 may include a first impurity region 112 having a first conductive type and a second impurity region 114 having a second conductive type. When the first conductive type may be a P type and the second conductive type may be an N type, the first impurity region 112 may act as the first anode Anode1 and the second impurity region 114 may act as the first cathode Cathode1. The first anode Anode1 and the first cathode Cathode1 may be configured to receive the bias.

The first impurity region 112 acting as the first anode Anode1 may be formed in the second impurity region 114 to make contact with the upper surface S1 of the substrate Sub. The first impurity region 112 may have a plate shape. The first impurity region 112 may be positioned at a central portion of the single photon avalanche diode 2. The bottom surface of the first impurity region 112 may be configured to make contact with the second impurity region 114. A first depletion region DR1 for providing a first operational voltage may be formed at an interface region between the first impurity region 112 and the second impurity region 114. A bias voltage for applying the first operational voltage to the single photon avalanche diode 2 to perform the photoelectric conversion or transformation using the first depletion region DR1 may be applied to the first cathode Cathode1. A ground voltage may be applied to the first anode Anode1, the second anode Anode2 and the second cathode Cathode1.

The second impurity region 114 acting as the first cathode Cathode1 may be formed on the substrate Sub to partially make contact with the upper surface S1 of the substrate Sub. The second impurity region 114 may be configured to surround the side surface and the bottom surface of the first impurity region 112. Thus, the second impurity region 114 may have a cylindrical shape. That is, the second impurity region 114 may have a planar annular shape viewed from the upper surface S1 of the substrate Sub. In contrast, the second impurity region 114 may have a planar plate shape viewed from the lower surface S2 of the substrate Sub. Further, the second impurity region 114 may have a cross-sectional U shape. The second impurity region 114 may be formed by a well-formation process.

FIGS. 2A and 2B may show one impurity region of each of the first impurity region 112 and the second impurity region 114. Alternatively, the first impurity region 112 may include a plurality of impurity regions stacked in the third direction D3 having the first conductive type. Further, the second impurity region 114 may include a plurality of impurity regions stacked in the third direction D3 having the second conductive type. The stacked impurity regions of each of the first impurity region 112 and the second impurity region 114 may have different doping concentrations. The different doping concentrations may be gradually decreased from the upper surface S1 to the lower surface S2 in the substrate Sub to prevent a punch caused by an expansion of the depletion region, thereby improving breakdown voltage characteristics.

The first junction structure 110 may further include a guard ring 116 formed in the second impurity region 114 to surround the side surface of the first impurity region 112. The guard ring 116 may be configured to make contact with the side surface of the first impurity region 112. The guard ring 116 may have a depth measured from the upper surface S1 of the substrate Sub may be greater than a depth of the first impurity region 112. When the guard ring 116 may include an impurity region having the first conductive type, the guard ring 116 may have a doping concentration less than a doping concentration of the first impurity region 112. A trench type isolation layer may include a trench formed at the upper surface S1 of the substrate Sub, and an insulation layer formed in the trench.

The second junction structure 120 may include a third impurity region 122 having the first conductive type and a fourth impurity region 124 having the second conductive type. When the first conductive type may be a P type and the second conductive type may be an N type, the third impurity region 122 may act as the second anode Anode2 and the fourth impurity region 124 may act as the second cathode Cathode2. The second anode Anode2 and the second cathode Cathode2 may be configured to receive the bias.

The third impurity region 122 acting as the second anode Anode2 may be configured to partially make contact with the upper surface S1 of the substrate Sub. The third impurity region 122 may be configured to make contact with a side surface and a bottom surface of the fourth impurity region 124. In order to improve the breakdown voltage characteristic of the single photon avalanche diode 2, the third impurity region 122 may have a doping concentration less than the doping concentration of the first impurity region 112. Further, a portion of the third impurity region 122 extended in the third direction D3 may have a horizontal width greater than a vertical depth of a portion of the third impurity region 122 extended in the first and second directions D1 and D2.

The third impurity region 122 may be configured to surround the side surface and the bottom surface of the first junction structure 110. Thus, the third impurity region 122 may have a cylindrical shape. The third impurity region 122 may have a planar annular shape viewed from the upper surface S1 of the substrate Sub. The third impurity region 122 may have a planar plate shape viewed from the lower surface S2 of the substrate Sub. Further, the third impurity region 122 may have a cross-sectional U shape. The third impurity region 122 may be configured to make contact with the bottom surface of the second impurity region 114. A second depletion region DR2 for providing a second operational voltage may be formed at an interface region between the second impurity region 114 and the third impurity region 122. The second operational voltage may be higher than the first operational voltage. A bias voltage for applying the second operational voltage to the single photon avalanche diode 2 to perform the photoelectric transformation using the second depletion region DR2 may be applied to the first cathode Cathode1 and the first anode Anode1. A ground voltage may be applied to the second anode Anode2 and the second cathode Cathode2.

The fourth impurity region 124 acting as the second cathode Cathode2 may be formed on the substrate Sub to partially make contact with the upper surface S1 of the substrate Sub. In order to improve the breakdown voltage characteristic of the single photon avalanche diode 2, the fourth impurity region 124 may have a doping concentration less than the doping concentration of the second impurity region 122. Further, a portion of the fourth impurity region 124 extended in the third direction D3 may have a horizontal width greater than a vertical depth of a portion of the fourth impurity region 124 extended in the first and second directions D1 and D2.

The fourth impurity region 124 may be configured to surround the side surface and the bottom surface of the third impurity region 122. Thus, the fourth impurity region 124 may have a cylindrical shape. The fourth impurity region 124 may have a planar annular shape viewed from the upper surface S1 of the substrate Sub. The fourth impurity region 124 may have a planar plate shape viewed from the lower surface S2 of the substrate Sub. Further, the fourth impurity region 124 may have a cross-sectional U shape. The fourth impurity region 124 may be configured to make contact with the side surface and the bottom surface of the third impurity region 122. A third depletion region DR3 for providing a third operational voltage may be formed at an interface region between the third impurity region 122 and the fourth impurity region 124. The third operational voltage may be higher than the second operational voltage. A bias voltage for applying the third operational voltage to the single photon avalanche diode 2 to perform the photoelectric transformation using the third depletion region DR3 may be applied to the second cathode Cathode2. A ground voltage may be applied to the first anode Anode1, the second anode Anode2 and the first cathode Cathode1.

Because the fourth impurity region 124 may be configured to make contact with the side surface of the third impurity region 122 as well as the bottom surface of the third impurity region 122, an area of the third depletion region DR3 may be readily enlarged. Thus, the single photon avalanche diode 2 may have improved breakdown voltage characteristics.

The third impurity region 122 and the fourth impurity region 124 may be formed by a well formation process and a deep well formation process. Therefore, FIGS. 2A and 3B may show each of the third impurity region 122 and the fourth impurity region 124 including one impurity region. Alternatively, each of the third impurity region 122 and the fourth impurity region 124 may include a deep well region and a well region. The deep well region may be formed in the substrate Sub. The deep well region may have a plate shape. The well region may be extended from the upper surface S1 of the substrate Sub. The well region may have a pipe shape. The well region having the pipe shape may include a plurality of well region stacked in the third direction D3.

Further, the second junction structure 120 may further include an isolation region 126 configured to surround the side surface of the first junction structure 110. The isolation region 126 may include one side surface configured to make contact with the second impurity region 114, and the other side surface configured to make contact with the third impurity region 122. The isolation region 126 may have a depth measured from the upper surface S1 of the substrate Sub substantially the same as the depth of the second impurity region 114. That is, the isolation region 126 may include a bottom surface of the third impurity region 122. The isolation region 126 may include an impurity region having the first conductive type, or a trench type isolation layer. When the isolation region 126 may include the impurity region having the first conductive type, the isolation region 126 may have a doping concentration less than the doping concentration of the third impurity region 122. The trench type isolation layer may include a trench formed at the upper surface S1 of the substrate Sub, and an isolation layer formed in the trench.

As mentioned above, the single photon avalanche diode 2 may include the first junction structure 110 and the second junction structure 120 that are stacked in the third direction D3 with surfaces of the first junction structure 110 and the second junction structure 120 being overlapped with each other to provide the three depletion regions DR1, DR2 and DR3. Therefore, the single photon avalanche diode 2 may have the three operational voltages corresponding to the three depletion regions DR1, DR2 and DR3. As a result, the single photon avalanche diode 2 may have improved photo detection sensitivity in various environments so that the single photon avalanche diode 2 may be widely used in various applications.

In exemplary embodiments, depending on areas and doping concentrations of the first and second junction structures 110 and 120, the first to third diodes D1, D2, D3 of the single photon avalanche diode 2 may have different breakdown voltages. The breakdown voltages of the first to third diodes D1 to D3 may depend on the doping concentrations in the first to fourth impurity regions 112, 114, 122 and 124 and voltage levels of reverse bias voltages. For example, depending on the type of irradiated light (e.g., the wavelength of the irradiated light) and exposure time, the number of electrons and holes (hereinafter, the number of photons) absorbed in the depletion regions DR1, DR2, DR3 of the first to third diodes D1, D2, D3 may vary.

For example, assuming that light is irradiated through the first surface S1 of the substrate Sub, each of the first to fourth impurity regions has a portion parallel to the first surface S1 (hereinafter, first to fourth parallel portions). The first to fourth parallel portions may refer to portions of the first to fourth impurity regions, which are closer to the first surface S1 through which light is received as compared to other portions of the first to fourth impurity regions. The first to fourth parallel portions of the first to fourth impurity regions have higher doping concentrations than other portions of the first to fourth impurity regions since the first to fourth parallel portions are closer to the first surface S1 through which light is received. The first parallel portion of the first impurity region has a higher doping concentration than another portion of the first impurity region, the second parallel portion of the second impurity region has a higher doping concentration than another portion of the second impurity region, the third parallel portion of the third impurity region has a higher doping concentration than another portion of the third impurity region, and the fourth parallel portion of the fourth impurity region has a higher doping concentration than another portion of the fourth impurity region. In some implementations, the first impurity region 112 having the first conductive type may have a higher doping concentration than those of the second to fourth impurity regions 114,122 and 124. The first depletion region DR1 may be spaced apart in the third direction D3 (i.e., a vertical direction) from the first surface S1 by a first depth. The second depletion region DR2 may be spaced apart in the third direction D3 from the first surface S1 by a second depth greater than the first depth. The third depletion region DR3 may be spaced apart in the third direction D3 from the first surface S1 by a third depth greater than the second depth.

When forming the first to fourth impurity regions (112, 114, 122, 124) as previously described, corresponding breakdown voltages are established among the diodes D1, D2, and D3. For example, the breakdown voltage of the first diode D1, hereinafter referred to as the "first breakdown voltage," is set to a lower than the breakdown voltage of the second diode D2, referred to as the "second breakdown voltage." The second breakdown voltage is set to a lower than the breakdown voltage of the third diode D3, hereinafter, the "third breakdown voltage." The breakdown voltage encompasses a negative voltage level. In this context, the absolute value of the third breakdown voltage surpasses that of the second breakdown voltage, while the absolute value of the second breakdown voltage exceeds that of the first breakdown voltage. Thus, a 'large breakdown voltage' will be defined as a high cathode voltage level, where the magnitude of the cathode voltage is substantial. Further, the single-photon avalanche diode 2 including the first to third diodes D1 to D3 may be irradiated with an incident light such as visible light or near infrared light.

In the exemplary embodiments as shown in FIGS. 2D and 2G, a first bias voltage V1 is applied to a first voltage terminal V1T connected to the first cathode Cathode1 of the first diode D1, and a ground voltage GND is applied to the second to fourth voltage terminals V2T, V3T, V4T. The absolute value of the first bias voltage V1 may be greater than the absolute value of the first breakdown voltage and may have a voltage level lower than the absolute values of the second and third breakdown voltages.

As the first bias voltage V1 is applied to the first cathode Cathode1 (ex., the second impurity region 114) and the ground voltage GND is applied to the first anode Anode1 (ex., the first impurity region 112), the first diode D1 is reverse biased exceeding the first breakdown voltage and reaching a first operating voltage Vop1, thereby operating as an avalanche diode. Further, when the first voltage V1 starts to be applied to the second impurity region 114 and the ground voltage GND starts to be applied to the first impurity region 112, the first depletion region DR1 starts to be generated at the junction of the first impurity region 112 and the second impurity region 114, so-called a PN junction.

As described, the photons from the irradiated light can be absorbed in the first depletion region DR1. When the first operating voltage Vop1 is applied to the first diode D1, that is, the first voltage V1 exceeds the absolute value of the first breakdown voltage, the photons in the first depletion region DR1 are dramatically multiplied. In this case, the first diode D1 operates as the avalanche diode, the first diode D1 can perform a photoelectric conversion operation. Thus, a first current corresponding to the photons multiplied in the first depletion region DR1 can be sensed in a sensing node NS.

The third impurity region 122 corresponding to the second anode Anode2 of the third diode D3 (or the anode of the second diode D2), and the fourth impurity region 124 corresponding to the second cathode Cathode2 of the third diode D3 do not operate as avalanche diodes because they all receive a ground voltage. Although a voltage difference (−V1) is generated between the second impurity region 114 and the third impurity region 122, the second diode does not operate as the avalanche diode, because the second breakdown voltage of the second diode D2 including the second impurity region 114 and the third impurity region 122 is set to be greater than the first breakdown voltage.

As shown in FIGS. 2E and 2G, a first voltage V1*a* may be applied to the first voltage terminal V1T, a second voltage (V2) that is substantially equal to the first voltage V1*a* may be applied to the second voltage terminal V2T, and the ground voltage GND may be applied to each of the third voltage terminal V3T and the fourth voltage terminal V4T. The first voltage V1*a* and the second voltage V2 may have a voltage level greater than the absolute value of the first and second breakdown voltages, and may have a voltage level less than the absolute value of the third breakdown voltage.

Since the first impurity region 112 and the second impurity region 114 receive the first and second voltages V1*a* and V2, which have the same voltage level, the first diode D1 including the first impurity region 112 and the second impurity region 114 does not act as the avalanche diode. Similarly, since the third impurity region 122 corresponding to the second anode Anode2 and the fourth impurity region 124 corresponding to the second cathode Cathode2 receive the same ground voltage GND, the third diode D3 including the third impurity region 122 and the fourth impurity region 124 does not act as the avalanche diode.

As the second impurity region 114 corresponding to the first cathode Cathode1 receives the first voltage V1*a* greater than the second breakdown voltage, and the third impurity region 122 corresponding to the second anode Anode2 receives the ground voltage GND, a reverse bias (for example, −V1*a*) greater than the second breakdown voltage is applied as the second operating voltage Vop2 to the second diode D2. Thus, the second diode D2 is operated as the avalanche diode. When the first voltage V1*a* starts to be applied to the second impurity region 114 and the ground voltage GND starts to be applied to the third impurity region 122, the second depletion region DR2 starts to be generated at the junction of the second impurity region 114 and the third impurity region 122.

When the second operating voltage Vop2 may be applied to the second diode D2, that is, the first voltage V1*a* exceeds the absolute value of the second breakdown voltage, the photons in the second depletion region DR2 are dramatically multiplied. Thus, the second diode D2 operates as the avalanche diode, the second diode D2 can perform the photoelectric conversion operation. Thus, a second current corresponding to the photons multiplied in the second depletion region DR2 can be sensed in the sensing node NS.

As shown in FIGS. 2F and 2G, the ground voltage GND may be applied to the first to third voltage terminals V1T, V2T and V3T, a fourth voltage V4 may be applied to the fourth voltage terminal V4T. For example, a voltage level of the fourth voltage V4 may be higher than the absolute values of the first to third breakdown voltages.

Accordingly, the first impurity region 112, the second impurity region 114 and the third impurity region 122 are all equipotential, so that the first diode D1 and the second diode D2 do not act the avalanche diode.

In some implementations, a reverse bias (for example, −V4) greater than the third breakdown voltage is applied as a third operating voltage Vop3 to the third diode D3. When the ground voltage GND starts to be applied to the third impurity region 122 and the fourth voltage V4 starts to be applied to the fourth impurity region 124, the third depletion region DR3 starts to be generated at the junction of the third impurity region 122 and the fourth impurity region 124.

Further, when the third operating voltage Vop3 may be applied to the third diode D3, that is, the fourth voltage V4 exceeds the absolute value of the third breakdown voltage, the photons in the third depletion region DR3 are dramatically multiplied. Thus, the third diode D3 operates as the avalanche diode, and the third diode D3 can perform the photoelectric conversion operation. Thus, a third current corresponding to the photons multiplied in the third depletion region DR3 can be sensed in the sensing node NS.

In exemplary embodiments, since sizes, positions and doping concentrations of the first to third depletion regions DR1~DR3, the amount of photons absorbed by the irradiated light may be different. Therefore, various photo-currents, for example, the first to third current can be obtained by varying the operating voltages Vop1~Vop3.

The single-photon avalanche diode according to the present embodiment may include a plurality of P-N junctions having different concentrations, different depths, and different areas. The plurality of P-N junctions may, upon application of different levels of reverse bias (i.e., different levels of operating voltage), generate depletion regions in different geometries and at different positions, resulting in different output photo currents.

Figure 3A:
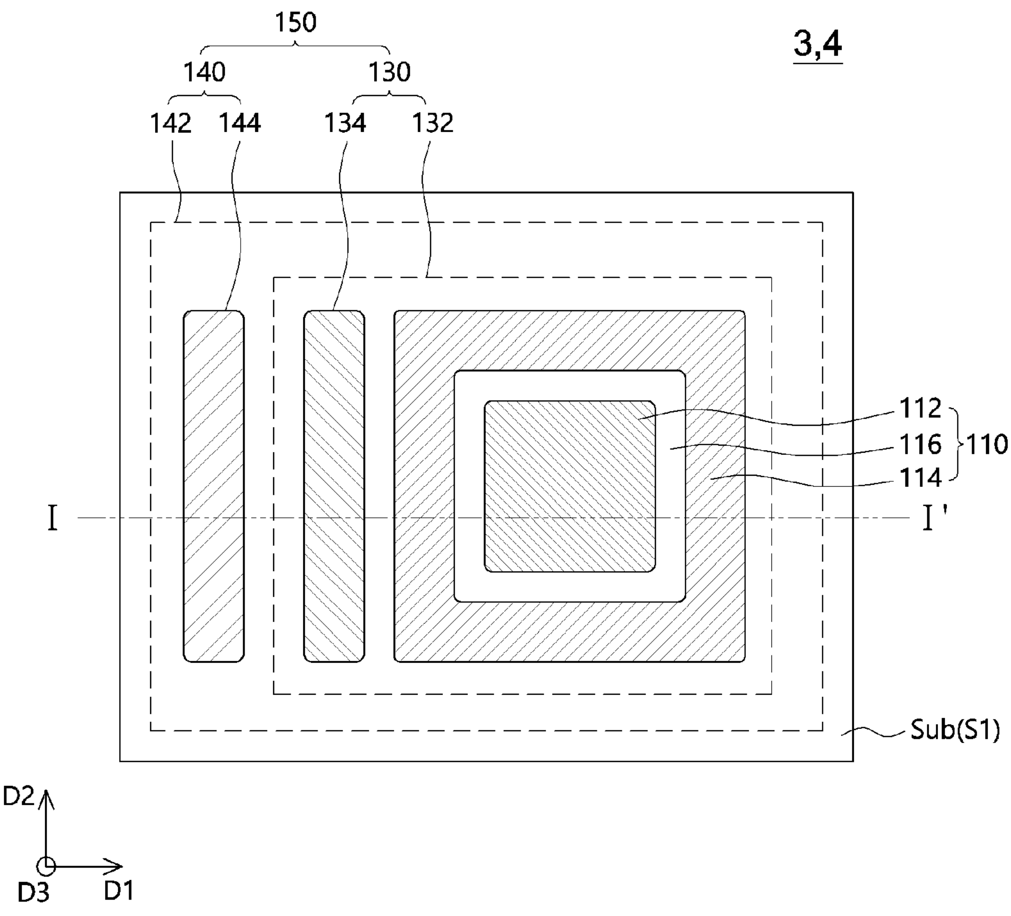
FIG. 3A is a plan view illustrating a single photon avalanche diode in accordance with example embodiments of the disclosed technology.
Figure 3B:
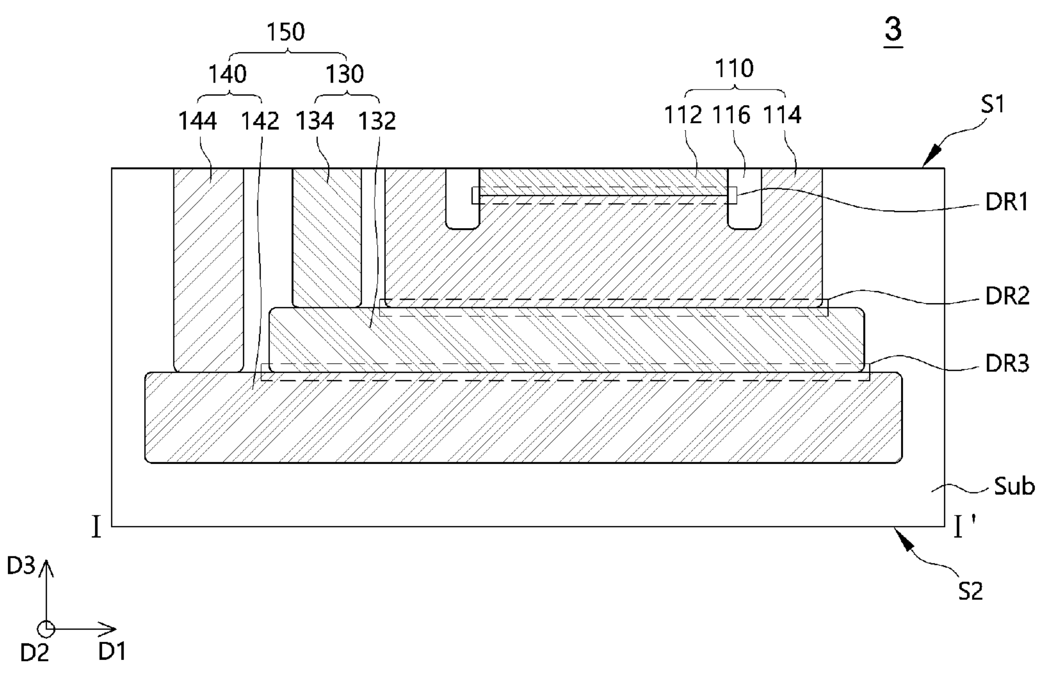
FIGS. 3B and 3C are cross-sectional views taken along a line I-I' in FIG. 3A.
Figure 3C:
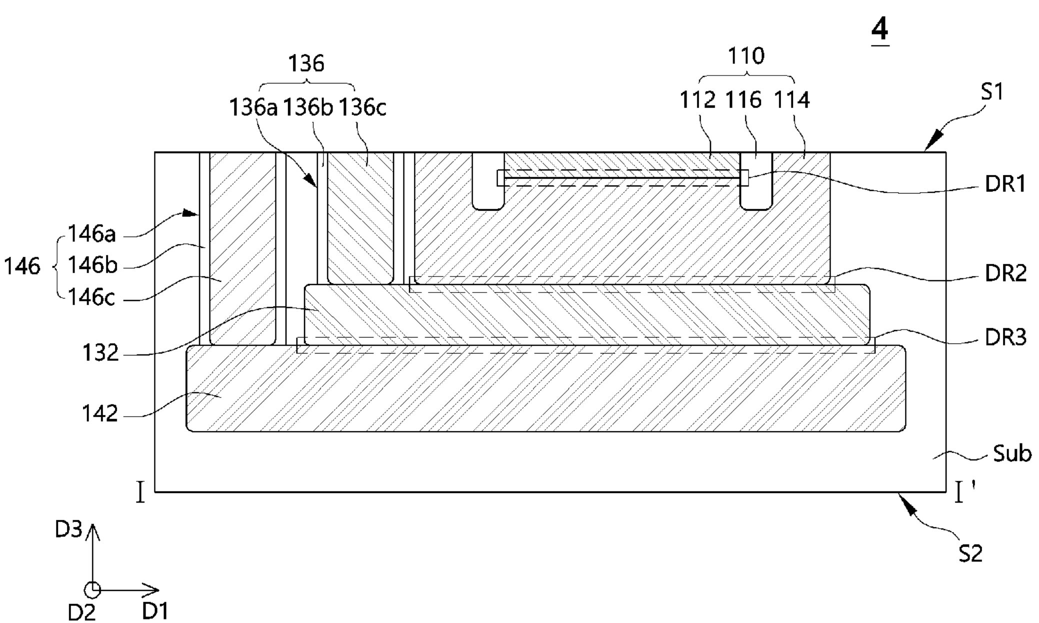

FIG. 3A is a plan view illustrating a single photon avalanche diode in accordance with example embodiments, and FIGS. 3B and 3C are cross-sectional views taken along a line I-I' in FIG. 3A. Hereinafter, the single photon avalanche diode having different operational voltages may be illustrated with reference to FIGS. 3A to 3C. Further, the same reference numerals may refer to the same elements and any further illustrations with respect to the same elements may be omitted herein for brevity.

Referring to FIGS. 3A and 3B, the single photon avalanche diode 3 of example embodiments may include a substrate Sub, a first junction structure 110 and a second junction structure 150. The substrate Sub may have an upper surface S1 and a lower surface S2. The first junction structure 110 may be formed on the substrate Sub to make contact with the upper surface S1 of the substrate Sub. The second junction structure 150 may be configured to surround a bottom surface of the first junction structure 110. The second junction structure 150 may be overlapped with the first junction structure 110 in the third direction D3. Each of the first junction structure 110 and the second junction structure 150 may include a P-N junction diode. Each of the first junction structure 110 and the second junction structure 150 may include a first anode Anode1, a first cathode Cathode1, a second anode Anode2 and a second cathode Cathode2 configured to receive a bias. Thus, a first anode Anode1, a first cathode Cathode1, a second anode Anode2 and a second cathode Cathode2 receive different voltages.

The first junction structure 110 may include a first impurity region 112 having a first conductive type and a second impurity region 114 having a second conductive type. The first junction structure 110 may further include a guard ring 116 formed in the second impurity region 114 to surround the side surface of the first impurity region 112. When the first conductive type may be a P type and the second conductive type may be an N type, the first impurity region 112 may act as the first anode Anode1 and the second impurity region 114 may act as the first cathode Cathode1. The first anode Anode1 and the first cathode Cathode1 may be configured to receive the bias. Any further illustrations with respect to the first junction structure 110 may be omitted herein for brevity.

The second junction structure 150 may include a third impurity region 130 having the first conductive type and a fourth impurity region 140 having the second conductive type. When the first conductive type may be a P type and the second conductive type may be an N type, the third impurity region 130 may act as the second anode Anode2 and the fourth impurity region 140 may act as the second cathode Cathode2. The second anode Anode2 and the second cathode Cathode2 may be configured to receive the bias.

The third impurity region 130 acting as the second anode Anode2 may include a first deep well region 132 and a first well region 134. The first deep well region 132 may be formed in the substrate Sub to make contact with the bottom surface of the second impurity region 114. The first well region 134 may be electrically connected with the first deep well region 132. The first well region 134 may be formed at the substrate Sub to make contact with the upper surface S1 of the substrate Sub. The first well region 134 may have a pillar shape. The first deep well region 132 may have a plate shape overlapped with the second impurity region 114. In FIG. 3B, the first deep well region is disposed to contact the entire bottom surface of the second impurity region 114, but other implementations are also possible. In FIG. 3B, the first well region 134 may include one impurity region. Alternatively, the first well region 134 may include a plurality of impurity regions stacked in the third direction D3.

The fourth impurity region 140 acting as the second cathode Cathode2 may include a second deep well region 142 and a second well region 144. The second deep well region 142 may be formed in the substrate Sub to make contact with the bottom surface of the first deep well region 132 of the third impurity region 130. The second well region 144 may be electrically connected with the second deep well region 142. The second well region 144 may be formed at the substrate Sub to make contact with the upper surface S1 of the substrate Sub. The second well region 144 may have a pillar shape. The second deep well region 142 may have a plate shape fully overlapped with the second impurity region 114 and the first deep well region 132. In FIG. 3B, the second well region 144 may include one impurity region. Alternatively, the second well region 144 may include a plurality of impurity regions stacked in the third direction D3.

In FIGS. 3A and 3B, each of the first well region 134 and the second well region 144 may have a planar bar shape. Alternatively, the first well region 134 may have a pipe shape spaced apart from the side surface of the second impurity region 114 to surround the side surface of the second impurity region 114. Similarly, the second well region 144 may have a pipe shape configured to surround the side surface of the first junction structure 110 together with the first well region 134. The second well region 144 may be configured to make contact with the side surface of the first well region 134.

Referring to FIGS. 3A and 3C, in a second junction structure 150 of a single photon avalanche diode 4 of example embodiments, a third impurity region 130 may include a first deep well region 132 and a first vertical electrode 136. The first deep well region 132 may be formed at the substrate Sub to make contact with the bottom surface of the second impurity region 114. The first vertical electrode 136 may be electrically connected with the first deep well region 132. The first vertical electrode 136 may have a pillar shape configured to make contact with the upper surface S1 of the substrate Sub. The first vertical electrode 136 may include a first trench 136*a*, a first insulation spacer 136*b* and a first conductive layer 136*c*. The first trench 136*a* may be formed at the upper surface S1 of the substrate Sub. The first insulation spacer 136*b* may be formed on a side surface of the first trench 136*a*. The first conductive layer 136*c* may be formed in the first trench 136*a*.

Similarly, in the second junction structure 150 of the single photon avalanche diode 4 of example embodiments, a fourth impurity region 140 may include a second deep well region 142 and a second vertical electrode 146. The second deep well region 142 may be formed at the substrate Sub to make contact with the bottom surface of the first deep well region 132. The second vertical electrode 146 may be electrically connected with the second deep well region 142. The second vertical electrode 146 may have a pillar shape configured to make contact with the upper surface S1 of the substrate Sub. The second vertical electrode 146 may include a second trench 146*a*, a second insulation spacer 146*b* and a second conductive layer 146*c*. The second trench 146*a* may be formed at the upper surface S1 of the substrate Sub. The second insulation spacer 146*b* may be formed on a side surface of the second trench 146*a*. The second conductive layer 136*c* may be formed in the second trench 146*a*.

In FIGS. 3A and 3C, each of the first well region 134 and the second well region 144 may have a planar bar shape. Alternatively, the first vertical electrode 136 may have a pipe shape spaced apart from the side surface of the second impurity region 114 to surround the side surface of the second impurity region 114. Similarly, the second vertical electrode 146 may have a pipe shape configured to surround the side surface of the first junction structure 110 together with the first vertical electrode 136.

Figure 4:
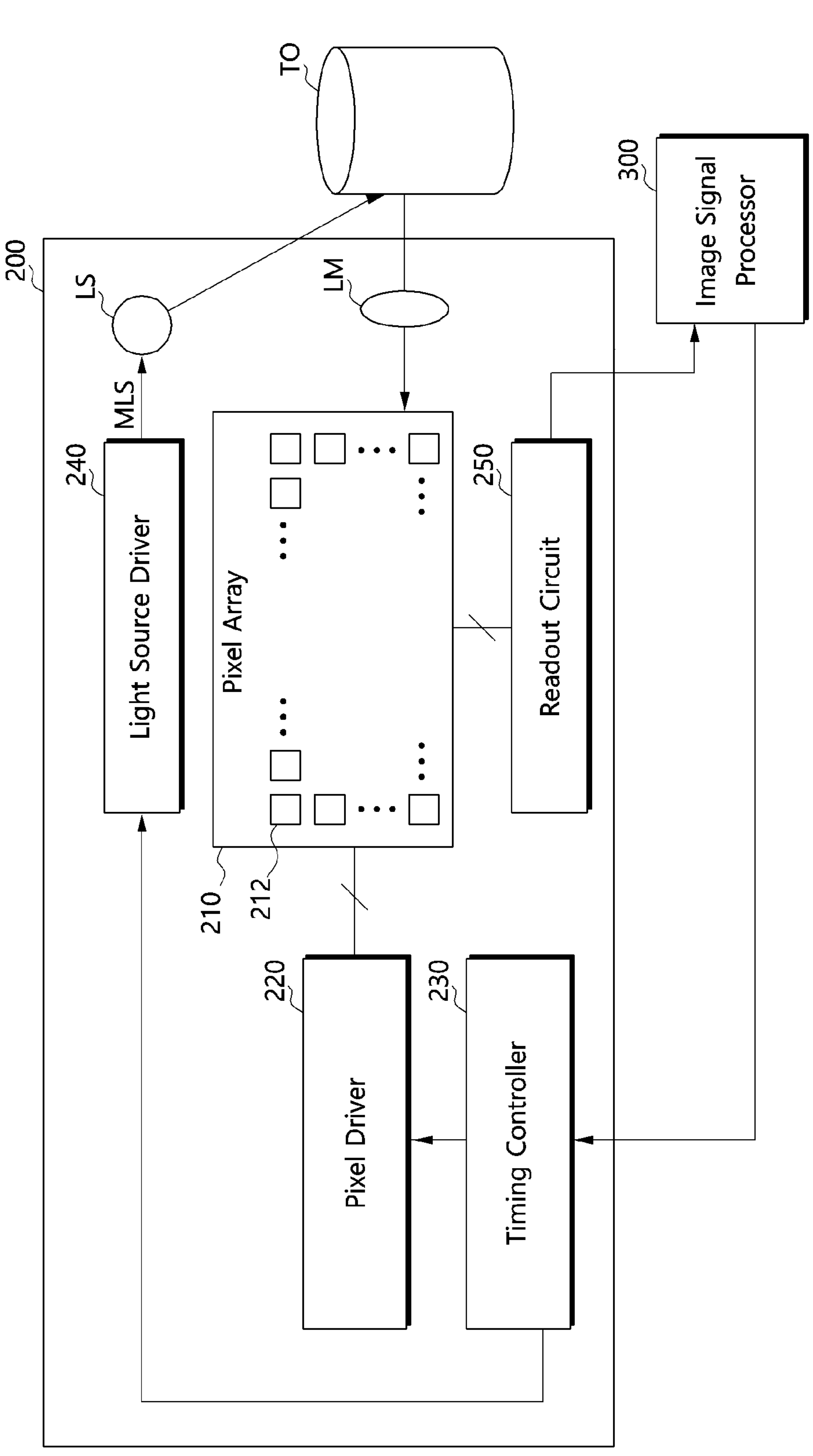
FIG. 4 is a view illustrating an electronic device including a single photon avalanche diode in accordance with example embodiments of the disclosed technology.

FIG. 4 is a view illustrating an electronic device including a single photon avalanche diode in accordance with example embodiments. The electronic device may include a photographing device including an image sensing device.

Referring to FIG. 4, the photographing device may include a digital still camera configured to photograph a static image, a digital video camera configured to photograph a video, etc. For example, the photographing device may include a digital single lens reflex (DSLR), a mirror less camera, a cellular phone, a smart phone, etc, not restricted to a specific kind. The photographing device may be a device including a lens an imaging device configured to photograph an object and generate an image.

The photographing device may include an image sensing device 200 and an image signal processor 300.

The image sensing device 200 may measure a distance using a principle of a time of flight (TOF). The image sensing device 200 may include a light source LS, a lens module LM, a pixel array 210, a pixel driver 220, a timing controller 230, a light source driver 240 and a readout circuit 250.

The light source LS may irradiate a light to an object TO in response to a clock signal MLS from the light source driver 240. The light source LS may include a laser diode for emitting a light having a specific wavelength such as an infrared light or a visible light, a light emitting diode (LED), a near infrared laser (NIR), a point light source, a white light lamp, a monochromatic illuminator, and a combination thereof. For example, the light source LS may emit an infrared light having a wavelength of about 800 nm to about 1,000 nm. FIG. 4 may show one light source LS. Alternatively, a plurality of the light sources LS may be arranged around the lens module LM.

The lens module LM may collect a light reflected from the object TO. The lens module LM may concentrate the reflected light on pixels of the pixel array 210. The lens module LM may include a condensing lens having a glass surface or plastic surface, a cylindrical optical element, etc. The lens module LM may include a lens group having at least one lens.

The pixel array 210 may include a plurality of SPAD pixels 212 sequentially arranged in a two-dimensional matrix structure. The SPAD pixels 212 of the pixel array 210 may be sequentially arranged in a column direction and a row direction. Each of the SPAD pixels 212 may perform a photoelectric transformation on an incident light through the lens module LM to generate and output an electrical signal as a pixel array corresponding to the incident light. The pixel signal may include information corresponding to the distance from the object OT, not a color of the object OT. Each of the SPAD pixels 212 may include the single photon avalanche diode of example embodiments.

The pixel array 210 including the SPAS pixels 212 may detect the distance from the object TO using a direct TOF manner. The TOF technology may directly measure a reciprocation time between a light irradiation time toward the object TO and a light incident time from the object TO to calculate the distance from the object OT based on the reciprocation time and a light velocity.

The pixel driver 220 may drive the pixel array 210 in accordance with controls of the timing controller 230. For example, the pixel driver 220 may generate a quenching control signal for controlling a quenching operation to decrease a reverse bias voltage, which may be applied to the SPAD pixel 212, to no more than the breakdown voltage. Further, the pixel driver 220 may generate a recharging control signal for controlling a recharging operation to provide a sensing node, which may be connected with the SPAD pixel 212, with charges.

The readout circuit 250 may be arranged at a side of the pixel array 210 to calculate a time delay between a reference pulse and a pulse signal outputted from each of the SPAD pixels 212. The readout circuit 250 may generate and store digital data corresponding to the time delay. The readout circuit 250 may include a time-to-digital circuit configured to perform the above-mentioned functions. The readout circuit 250 may transmit the stored digital data to the image signal processor 300 in accordance with the controls of the timing controller 230.

The timing controller 230 may control total operations of the image sensing device 200. The timing controller 230 may generate a timing signal for controlling operations of the pixel driver 220 and the light source driver 240. Further, the timing controller 230 may control an activation or an inactivation of the readout circuit 250. The timing controller 230 may simultaneously or sequentially transmit the digital data in the readout circuit 250 to the image signal processor 300.

The light source driver 240 may generate the clock signal for driving the light source LS in accordance with the controls of the timing controller 230.

The image signal processor 300 may process the digital data inputted from the image sensing device 200 to generate depth image for representing the distance from the object OT. Particularly, the image signal processor 300 may calculate the distance by the pixels from the object OT based on the time delay represented by the digital data received from the readout circuit 250.

The image signal processor 300 may control the operations of the image sensing device 200. Particularly, the image signal processor 300 may analyze the digital data inputted from the image sensing device 200 to determine modes of the image sensing device 200. The image signal processor 300 may control the image sensing device 200 to be operated in a determined mode.

The image signal processor 300 may remove noises from the generated depth image. Further, the image signal processor 300 may process the image signal to improve image quality. The depth image outputted from the image signal processor 300 may be stored in the photographing device, an internal memory or an external memory of other devices with the photographing device, etc., automatically or by a user's request. The depth image may be displayed on a display device. The depth image outputted from the image signal processor 300 may be used for controlling operations of the photographing device or other devices.

Figure 5:
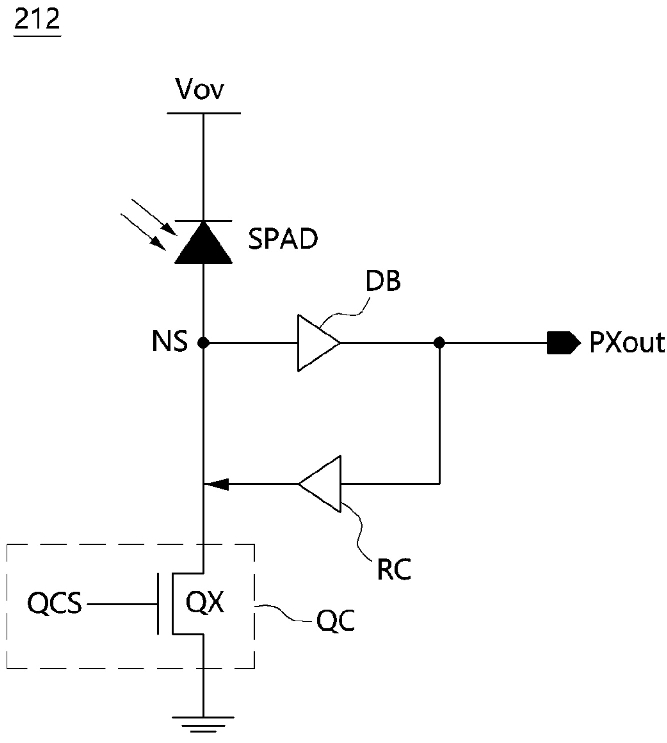
FIG. 5 is an equivalent circuit diagram illustrating an SPAD pixel in a pixel array of FIG. 4.

FIG. 5 is an equivalent circuit diagram illustrating an SPAD pixel in a pixel array of FIG. 4.

Referring to FIGS. 4 and 5, the SPAD pixel 212 may include the single photon avalanche diode (SPAD) as the photoelectric transformation element, a quenching circuit QC, a digital buffer DB and a recharging circuit RC. Here, the SPAD may include the structure in FIGS. 1A and 1B, the structure in FIGS. 2A and 2B, the structure in FIGS. 3A and 3B, or the structure in FIGS. 3A and 3C. The SPAD may include the multi-depletion regions and the multi-operational voltages corresponding to the multi-depletion regions.

The SPAD may detect the single photon reflected from the object TO to generate the current pulse corresponding to the single photon. The SPAD may include the photo diode having the photosensitive P-N junction. The avalanche breakdown may be triggered by an incident single photon in the Geiger mode where a reverse bias voltage including a voltage between a cathode and an anode higher than a breakdown voltage may be applied to generate the current pulse. The avalanche process may include triggering the avalanche breakdown by the single photon to generate the current pulse.

One terminal such as the cathode of the SPAD may receive a first bias voltage Vov for applying the reverse bias voltage higher than the breakdown voltage. The first bias voltage Vov may correspond to the operational voltage of any one of the multi-operational voltages to the SPAD. For example, the first bias voltage Vov may be a positive voltage having an absolute value lower than an absolute value of the breakdown voltage. The other terminal such as the anode of the SPAD may be connected to a sensing node NS. The SPAD may detect the single photon to output the generated current pulse to the sensing node NS.

The quenching circuit QC may control the reverse bias voltage applied to the SPAD. When a time of the avalanche process, or a time after the pulse generation of the clock signal MLS may be elapsed, a quenching transistor QX of the quenching circuit QC may be turned-on in response to a quenching control signal QCS to electrically connect the sensing node NS with a ground terminal. Thus, the reverse bias voltage applied to the SPAD may be decreased to a value less than the breakdown voltage and the quenching can occur to stop the avalanche process.

The digital buffer DB may sample the analog current pulse inputted into the sensing node NS to convert the analog current pulse into a digital pulse signal. The sampling manner may include converting the analog current pulse into a pulse signal having a logic level of '0' or '1' in accordance with as to whether a level of the current pulse may be no less than a critical level or not, not restricted within a specific manner. Thus, the pulse signal outputted from the digital buffer DB may be transmitted to the readout circuit 250 as a pixel output signal PXout.

The recharging circuit RC may implant charges into the sensing node NS to enter the SPAD into the Geiger mode for inducing the avalanche breakdown after quenching the avalanche process by the quenching circuit QC. For example, the recharging circuit RC may include a switch such as a transistor configured to selectively connect a second bias voltage with the sensing node NS in accordance with a recharging control signal. When the switch may be turned-on, a voltage of the sensing node NS may reach to the second bias voltage. For example, a sum of an absolute value of the second bias voltage and an absolute value of the first bias voltage may be higher than an absolute value of the breakdown voltage. The second bias voltage may be a negative voltage. Thus, the SPAD may enter into the Geiger mode to perform the avalanche process by the single photon received from next timing.

In example embodiments, the quenching circuit QC and the recharging circuit RC may include active element. Alternatively, the quenching circuit QC and the recharging circuit RC may include passive element. For example, the quenching transistor QX of the quenching circuit QC may be replaced by a resistor. The quenching control signal QCS and the recharging control signal may be transmitted to the pixel driver 220 in FIG. 4.

The readout circuit 250 may include a digital logic and an output buffer. The digital logic may calculate the time delay between the pulse signal of the SPAD pixel 212 and the reference pulse to generate the digital data. The output buffer may store the generated digital data. The digital logic and the output buffer may include a time-to-digital (TDC) circuit. The reference pulse may include a pulse of the clock signal MLS.

The above described embodiments are examples of implementation of the disclosed technology. Variations and enhancements of the disclosed embodiments and other embodiments may be made based on what is disclosed and/or illustrated in this patent document.

What is claimed is:

1. A single photon avalanche diode, comprising:

a first diode including a first PN junction vertically spaced from a light-receiving surface by a first depth;

a second diode in partial contact with the first diode, the second diode including a second PN junction vertically spaced from the light-receiving surface by a second depth greater than the first depth; and a third diode in partial contact with the second diode, the third diode including a third PN junction spaced from the light-receiving surface by a third depth greater than the second depth, wherein the first to third diodes have different breakdown voltages from one another, and wherein, based on levels of reverse bias voltages applied to the first to third diodes, at least one of the first to third diodes is configured to operate as a single-photon avalanche diode.

2. The single photon avalanche diode of claim 1, wherein the first diode includes:

a first impurity region with a first conductive type adjacent to the light-receiving surface; and a second impurity region in contact with a lower surface of the first impurity region and the second impurity region having a second conductive type being opposite to the first conductive type, wherein the first PN junction corresponds to a contact portion between the first impurity region and the second impurity region, and wherein a first depletion region of the first diode exists in the first PN junction.

3. The single photon avalanche diode of claim 2, wherein the second diode includes:

the second impurity region; and a third impurity region with the first conductive type in contact a lower surface of the second impurity region, wherein the second PN junction corresponds to a contact portion between the second impurity region and the third impurity region, and wherein a second depletion region of the second diode exists in the second PN junction.

4. The single photon avalanche diode of claim 3, wherein the third diode includes:

the third impurity region; and a fourth impurity region with the second conductive type in contact a lower surface of the third impurity region, wherein the third PN junction corresponds to a contact portion between the third impurity region and the fourth impurity region, and wherein a third depletion region of the third diode exists in the third PN junction.

5. The single photon avalanche diode of claim 4, wherein the first to fourth impurity regions have first to fourth parallel portions, respectively, and wherein the first to fourth parallel portions have higher doping concentrations as compared to other portions of the first to fourth impurity regions.

6. The single photon avalanche diode of claim 1, further comprising:

a substrate including the light-receiving surface, wherein the first diode, the second diode, and the third diode are sequentially arranged in a depth direction of the substrate from the light-receiving surface.

7. The single photon avalanche diode of claim 1, further comprising:

isolation regions arranged between the first diode and the second diode, and between the second diode and the third diode.

8. The single photon avalanche diode of claim 1, further comprising:

a substrate including the light-receiving surface, wherein the third diode is formed in the substrate.

9. The single photon avalanche diode of claim 1, wherein the first diode includes a first depletion region spaced from the light-receiving surface by the first depth, the second diode includes a second depletion region spaced from the light-receiving surface by the second depth, and the third diode includes a third depletion region spaced from the light-receiving surface by the third depth.

10. The single photon avalanche diode of claim 9, further comprising:

a first isolation region disposed at one side of the first depletion region, a second isolation region disposed at one side of the second depletion region, and a third isolation region disposed at one side of the third depletion region.

11. The single photon avalanche diode of claim 1, wherein the breakdown voltage of the first diode is higher than the breakdown voltage of the second diode, and the breakdown voltage of the second diode is higher than the breakdown voltage of the third diode.

12. A single photon avalanche diode, comprising:

a first diode including a first cathode region and a first anode region formed in a portion of the first cathode region to form a first PN junction, wherein the first cathode region and the first anode region are exposed on a light-receiving surface;

a second diode including a second anode region that includes a first portion contacting the first cathode region to form a second PN junction, and a second portion connected to the first portion and extending toward the light-receiving surface;

a third diode including a second cathode region that includes a third portion contacting the second anode region to form a third PN junction, and a fourth portion connected to the third portion and extending toward the light-receiving surface;

a first isolation region disposed in the first cathode region at a side of the first PN junction a second isolation region disposed between the second PN junction and the second portion; and a third isolation region disposed between the third PN junction and the fourth portion, wherein the first to third diodes have different breakdown voltages from one another, and wherein, based on levels of reverse bias voltages applied to the first to third diodes, at least one of the first to third diodes is configured to operate as a single-photon avalanche diode.

13. The single photon avalanche diode of claim 12, wherein a depth of the second isolation region is deeper than a depth of the first isolation region, and a depth of the third isolation region is deeper than the second isolation region.

14. The single photon avalanche diode of claim 12, wherein the breakdown voltage of the first diode is higher than the breakdown voltage of the second diode, and the breakdown voltage of the second diode is higher than the breakdown voltage of the third diode.

* * * * *